(12) United States Patent
Lin et al.

(10) Patent No.: US 8,103,978 B2
(45) Date of Patent: Jan. 24, 2012

(54) METHOD FOR ESTABLISHING SCATTERING BAR RULE

(75) Inventors: Chun-Yu Lin, Kaohsiung (TW); Chia-Jung Liou, Taoyuan County (TW); Cheng-Hung Ku, Hsinchu (TW); Feng-Yuan Chiu, Hsinchu County (TW); Chun-Kuang Lin, Hsinchu County (TW); Chih-Chiang Huang, Taoyuan County (TW)

(73) Assignee: ProMOS Technologies Inc., Hsinchu (TW)

( * ) Notice: Subject to any disclaimer, the term of this patent is extended or adjusted under 35 U.S.C. 154(b) by 539 days.

(21) Appl. No.: 12/198,121

(22) Filed: Aug. 26, 2008

(65) Prior Publication Data

US 2009/0276750 A1    Nov. 5, 2009

(30) Foreign Application Priority Data

May 5, 2008 (TW) .............................. 97116530 A

(51) Int. Cl.
*G06F 17/50* (2006.01)

(52) U.S. Cl. ........................................................ 716/50

(58) Field of Classification Search ................. 716/1, 21, 716/50
See application file for complete search history.

(56) References Cited

U.S. PATENT DOCUMENTS

| | | | |
|---|---|---|---|
| 2002/0091985 A1* | 7/2002 | Liebmann et al. | 716/19 |
| 2004/0139418 A1* | 7/2004 | Shi et al. | 716/19 |
| 2004/0166418 A1* | 8/2004 | Samuels | 430/5 |
| 2005/0144583 A1* | 6/2005 | Frankowsky | 716/10 |
| 2005/0202321 A1* | 9/2005 | Gordon et al. | 430/5 |
| 2006/0057475 A1* | 3/2006 | Liebmann et al. | 430/5 |
| 2006/0062445 A1* | 3/2006 | Verma et al. | 382/144 |
| 2007/0122719 A1* | 5/2007 | Van Den Broeke et al. | 430/5 |
| 2008/0138719 A1* | 6/2008 | Park | 430/5 |
| 2008/0138720 A1* | 6/2008 | Park | 430/5 |
| 2010/0009139 A1* | 1/2010 | Yang | 428/195.1 |
| 2010/0099032 A1* | 4/2010 | Zou et al. | 430/5 |

OTHER PUBLICATIONS

Authored by Lin, et al., article titled "Novel One-Dimensional Scattering Bar Rule via Computer Aided Design", adopted from Advanced Semiconductor Manufacturing Conference, 2008. ASMC 2008. IEEE/SEMI Volume , Issue , May 5-7, 2008 pp. 173-178.

* cited by examiner

*Primary Examiner* — Suchin Parihar

(74) *Attorney, Agent, or Firm* — Jianq Chyun IP Office

(57) ABSTRACT

A method for establishing a scattering bar rule for a mask pattern for fabricating a device is provided. The method is described as follows. First, at least one image simulation model is established according to the mask pattern and a process reference set used for fabricating the device based on the mask pattern. Next, a plurality of scattering bar reference sets is applied to the image simulation model so as to generate a plurality of simulation images, respectively. Further, a portion of the simulation images are selected to be a plurality of candidate layouts according to a screening criterion. Next, one of the candidate layouts is determined to be a pattern layout according to a selection rule, and the scattering bar reference set corresponding to the pattern layout is determined to be a scattering bar rule of the mask pattern.

8 Claims, 2 Drawing Sheets

METHOD FOR ESTABLISHING SCATTERING BAR RULE

CROSS-REFERENCE TO RELATED APPLICATION

This application claims the priority benefit of Taiwan application serial no. 97116530, filed on May 5, 2008. The entirety of the above-mentioned patent application is hereby incorporated by reference herein and made a part of specification.

BACKGROUND OF THE INVENTION

1. Field of the Invention

The present invention relates to a method for designing a mask pattern. More particularly, the present invention relates to a method for establishing a scattering bar rule.

2. Description of Related Art

When dimension of devices are minimizing, illumination system are exploited their limit. Some resolution enhancement technologies (RET) such as optical proximity correction (OPC), off-axis illumination (OAI), sub resolution assist features (SRAF) and alternating phase shift masks are developed to promote the resolution of lithography.

The scattering bar, as known as SRAF, successfully resolves the focus latitude problem. The scattering bar is extensively applied on mask layouts that are sensitive to defocus variation. For those sparse layout environments, scattering bar produces more dense proximity. However, the scattering bar risks printing out. Accordingly, the defocus may be enlarged while layout with the assist features is transferred onto the target material. Hence, the exposure latitude is lost. Typically, the scattering bar rule is determined by collecting empirical data. However, such scattering bar rule cannot simply applied to the diversified layout patterns. That is, after the scattering bar rule is applied to the mask pattern, the resolution differences between the sparse patterns and the dense patterns are still existed and it is necessary to apply another resolution enhancement technique, such as the OPC, to mitigate the resolution differences.

SUMMARY OF THE INVENTION

The present invention is directed to a method for establishing a scattering bar rule, for automatically simulating aerial images of mask patterns with diverse kinds of scattering bar rules, and selecting optimal scattering bar rules adapted to several specific types of patterns.

The present invention provides a method for establishing a scattering bar rule, adapted to a mask pattern for fabricating a device. The method is described as follows. First, at least one image simulation model is established according to the mask pattern and a process reference set used for fabricating the device based on the mask pattern. Next, a plurality of scattering bar reference sets is applied to the image simulation model so as to generate a plurality of simulation images, respectively. Further, a portion of the simulation images are selected to be a plurality of candidate layouts according to a screening criterion. Next, one of the candidate layouts is determined to be a pattern layout according to a selection rule, and the scattering bar reference set corresponding to the pattern layout is determined to be a scattering bar rule of the mask pattern.

In the present invention, by setting the scattering bar reference sets, the simulation images of the mask pattern as being transferred onto a wafer via a photolithographic process are generated, and the candidate layouts are screened from the simulation images according to the screening criterion, and then an optimal pattern layout is selected according to the selection rules, and the scattering bar reference set corresponding to the pattern layout is determined to be the scattering bar rule of the mask pattern. Based on the screening criterion, when the selected scattering bar rule is applied to device patterns with different sizes on the mask pattern, a layout of the scattering bar is not shown on the wafer as the mask pattern is printed. Moreover, based on the selection rules, when the selected scattering bar rule is applied to the device patterns with different line widths and different spaces on the mask pattern, the device products possess better consistent even though the process references vary from process to process, and therefore the reliability of the fabrication process of the device is improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
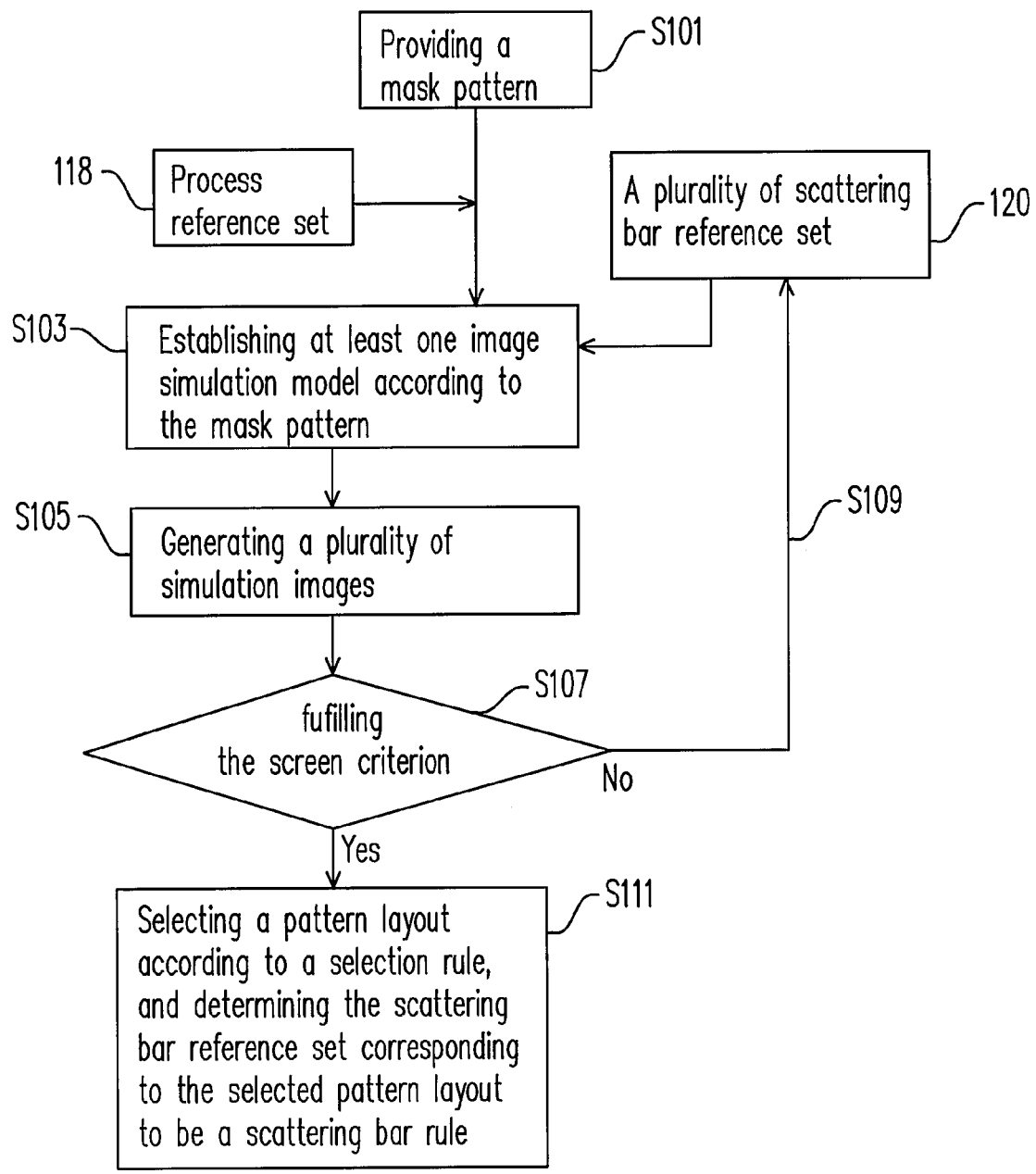
FIG. 1 is a flowchart illustrating a method for establishing a scattering bar rule according to a preferred embodiment of the present invention.
Figure 2:
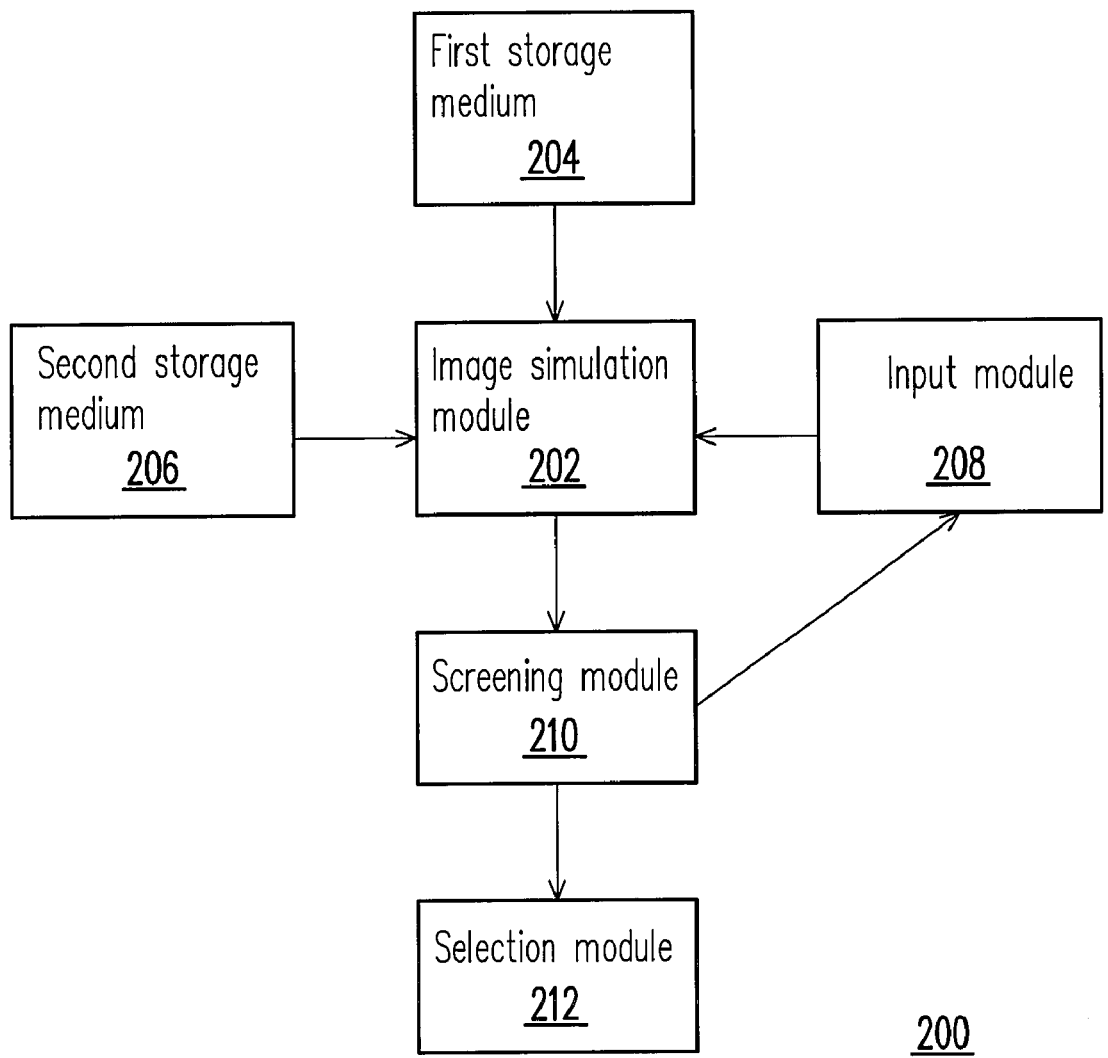
FIG. 2 is a schematic diagram illustrating an apparatus for establishing a scattering bar rule according to a preferred embodiment of the present invention.

FIG. 1 is a flowchart illustrating a method for establishing a scattering bar rule according to a preferred embodiment of the present invention. FIG. 2 is a schematic diagram illustrating an apparatus for establishing a scattering bar rule according to a preferred embodiment of the present invention. Referring to FIG. 1 and FIG. 2, in step S101, a mask pattern is provided to a image simulation module 202 of an apparatus 200 for establishing a scattering bar rule. The mask pattern is, for example but not limited to, used for fabricating a device. Further, the mask pattern has a plurality of device patterns with different sizes and shapes according to a specification of the device to be fabricated. Next, in step S103, the image simulation module 202 establishes at least one image simulation model corresponding to the mask pattern according to pattern data of the mask pattern and a process reference set 118 used for fabricating the device. Wherein, the pattern data of the mask pattern can be, for example but not limited to, obtained by respectively converting the device patterns in the mask pattern to be coordinates, pattern widths, pattern quantity and pattern spaces. Moreover, the process reference set 118 includes at least one experience data set and at least one process behavior data. The experience data set is for example the corresponding pattern data presented on a wafer after the mask pattern is printed on the wafer via a photolithographic process, wherein the pattern data include the coordinates, the pattern widths, the pattern quantity and the pattern spaces of the patterns on the wafer. The experience data set is for example, stored in a first storage medium 204 of the apparatus 200. In the first storage medium 204, the experience data sets are stored respectively according to a device type. Moreover, the process behavior data can be, for example but not limited to, the setting conditions of an optical machine used for performing the photolithographic process when the mask pattern is printed on the wafer, wherein the process behavior data include exposure dose parameters, exposure time, developing time and operational parameters of an etching machine, etc. The process behavior data can be, for example, stored in a second storage medium 206 of the apparatus 200. In the second storage medium 206, the corresponding process behavior data are stored respectively according to the device type. As to the same mask pattern, different experience data sets and different process behavior data can be combined to produce a plurality of image simulation models.

Next, referring to FIG. 1 and FIG. 2, in step S105, several scattering bar reference sets 120 are set and inputted to the image simulation models established by the image simulation module 202 via an input module 208 of the apparatus 200, so as to generate a plurality of corresponding simulation images. That is, by using the scattering bar reference sets, the possible printed patterns on the wafer from the mask pattern are fine tuned, so as to respectively generate the simulation images. Moreover, the scattering reference sets include numbers of scattering bars collocated with a device pattern, a scattering bar width, a scattering bar space and a device pattern-scattering bar space, etc.

Next, in step S107, a screening module 210 of the apparatus 200 screens a portion of the simulation images to be a plurality of candidate layouts according to a screening criterion. Each of the candidate layouts only displays a device pattern layout corresponding to the device. On the other words, the selected simulated printed pattern (i.e. the simulation image) on a wafer only displays the device pattern layout, and no scattering bar layout is printed. The screening criterion can be, for example but not limited to, a customized criterion which is determined according to characteristics of a product and process conditions, etc. In one embodiment, the screening criterion is that when each of the simulation images in a sibling simulation layout group, in which the simulation images are all generated based on different process reference sets and the same scattering bar reference set, does not include a scattering bar layout corresponding to the scattering bar reference set, the mask layouts applied in this sibling simulation layout group are then all defined to be the candidate layouts. On the other words, for the same scattering bar reference set, only when each of the simulation images in the sibling simulation layout group generated based on different process reference set (for example, the process reference set with the optimal focus condition, the process reference set with defocus condition, the process reference set with the optimal exposure dose condition and the process reference set with sub optimal exposure dose condition) fulfils the requirement that no scattering bar layout is printed, may each of the simulation images of the sibling simulation layout group is regarded as the candidate layout. That is, in this embodiment, the scattering bar reference set must have a relatively large process window, so that the scattering bar layout may still not be shown in the printed pattern even if a non-ideal process reference set is applied.

In another embodiment, after the screening criterion is applied, if the simulation images are all not fulfilled the screening criterion and the candidate layouts cannot be generated, a step of modifying the input scattering bar reference sets 120 is performed (S109). Under this circumstance, the modified scattering bar reference sets are applied to the image simulation model, so as to generate the simulation images (i.e. the step S105 is repeated). Then, the candidate layouts are re-selected from the simulation images according to the screening criterion (i.e. the step S107 is repeated).

Next, after the candidate layouts are selected based on the screening criterion, a selection module 212 of the apparatus 200 then selects one of the candidate layouts to be a pattern layout according to a selection rule, and the scattering bar reference set corresponding to the pattern layout is determined to be a scattering bar rule of the mask pattern (step S111). The selection rule can be, for example, a customized rule which is determined according to characteristics of the product and the process conditions, etc. In one embodiment, the selection rule is that the selected candidate layout has a minimum line width difference between the selected candidate layout and the mask pattern. Accordingly, the scattering bar reference set corresponding to the selected candidate layout with minimum line width difference between the candidate layout and the mask pattern is defined to be a scattering bar rule of the mask pattern.

In another embodiment, the selection rule can be that when the line width difference between the candidate layouts in the same candidate layout group, wherein the candidate layouts in the same candidate layout groups are generated based on different process reference sets and the same scattering bar reference set, is minimum, the scattering bar reference set corresponding to the candidate layout group is then defined to be the scattering bar rule. On the other words, among the aforementioned sibling simulation layout groups fulfilling the screening criterion, a sibling simulation layout group has the minimum line width difference between the simulation images thereof is selected, and the scattering bar reference set corresponding to the selected sibling simulation layout group is then defined to be the scattering bar rule of the mask pattern used for fabricating the device. That is, in this embodiment, the selection rule is to select a scattering bar reference set having a preferred process window, which may generate similar pattern printing results based on different process reference sets.

In the present invention, by setting the scattering bar reference sets, the simulation images of the mask pattern as being printed onto a wafer via a photolithographic process are generated, and the candidate layouts are screened from the simulation images according to the screening criterion, and then an optimal pattern layout is selected according to the selection rule, and the scattering bar reference set corresponding to the pattern layout is determined to be the scattering bar rule of the mask pattern. Based on the screening criterion, when the selected scattering bar rule is applied to device patterns with different sizes on the mask pattern, a layout of the scattering bar is not shown on the wafer as the mask pattern is printed. Moreover, based on the selection rule, when the selected scattering bar rule is applied to the device patterns with different line widths and different spaces on the mask pattern, the device products possess better consistent even though the process references vary from process to process, and therefore the reliability of the fabrication process of the device is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for an apparatus to establish a scattering bar rule for a mask pattern for fabricating a device, the method comprising:

an image simulation module of the apparatus establishing at least one image simulation model according to the mask pattern and a process reference set used for fabricating the device based on the mask pattern;

the image simulation module applying a plurality of scattering bar reference sets to the image simulation model so as to generate a plurality of simulation images, respectively;

a screening module of the apparatus screening a portion of the simulation images to be a plurality of candidate layouts according to a screening criterion; and a selection module of the apparatus selecting one of the candidate layouts to be a pattern layout according to a selection rule, and determining the scattering bar reference set corresponding to the pattern layout to be a scattering bar rule of the mask pattern.

2. The method for establishing a scattering bar rule as claimed in claim 1, wherein the process reference set includes at least one experience data set and at least one process behavior data.

3. The method for establishing a scattering bar rule as claimed in claim 1, wherein the scattering bar reference sets include numbers of scattering bars collocated with a device pattern, a scattering bar width, a scattering bar space and a device pattern-scattering bar space.

4. The method for establishing a scattering bar rule as claimed in claim 1, wherein each of the candidate layouts only displays a device pattern layout corresponding to the device.

5. The method for establishing a scattering bar rule as claimed in claim 1, wherein the screening criterion comprises:

defining the simulation images to be the candidate layouts when each of the simulation images generated based on different process reference sets and the same scattering bar reference set does not include a scattering bar layout corresponding to the scattering bar reference set.

6. The method for establishing a scattering bar rule as claimed in claim 1, wherein the selection rule comprises:

defining the scattering bar reference set corresponding to the candidate layouts generated based on different process reference sets and the same scattering bar reference set to be the scattering bar rule, when there is a minimum line width difference between the candidate layouts generated based on different process reference sets and the same scattering bar reference set.

7. The method for establishing a scattering bar rule as claimed in claim 1, wherein the selection rule comprises:

defining the scattering bar reference set corresponding to the candidate layout to be the scattering bar rule when there is a minimum line width difference between one of the candidate layouts and the mask pattern.

8. The method for establishing a scattering bar rule as claimed in claim 1, wherein when the simulation images are all not matched to the screening criterion, and the candidate layouts cannot be generated, before the step of selecting the pattern layout, the method further comprises:

the apparatus modifying the scattering bar reference sets;

the apparatus performing a step of re-applying the modified scattering bar reference sets to the image simulation model, so as to generate the simulation images; and the apparatus re-selecting the candidate layouts from the simulation images according to the screening criterion.

* * * * *